United States Patent [19]

Rider

[11] 4,431,935
[45] Feb. 14, 1984

[54] SENSOR STRUCTURE INCORPORATING MULTIPLE PIEZOELECTRIC GENERATORS

[75] Inventor: Billie F. Rider, Cedar Rapids, Iowa

[73] Assignee: Rockwell International Corporation, El Segundo, Calif.

[21] Appl. No.: 302,002

[22] Filed: Sep. 15, 1981

[51] Int. Cl.³ ............................................. H01L 41/02
[52] U.S. Cl. ...................................... 310/331; 73/505; 310/329; 310/364; 310/366
[58] Field of Search ........................ 310/329, 329, 330, 310/331, 332, 364, 366; 73/504, 505

[56] References Cited

U.S. PATENT DOCUMENTS

| | | | |
|---|---|---|---|
| 2,716,893 | 9/1955 | Birdsall | 73/504 |
| 3,271,622 | 9/1966 | Malagodi et al. | 310/331 |
| 3,760,203 | 9/1973 | Guntersdorfer | 310/331 |
| 3,842,681 | 10/1974 | Mumme | 73/505 |
| 4,113,387 | 9/1978 | Shutt | 356/106 LR |

Primary Examiner—J. D. Miller
Assistant Examiner—D. L. Rebsch
Attorney, Agent, or Firm—Terry M. Blackwood; H. Fredrick Hamann

[57] ABSTRACT

Sensor structure integrates multiple piezoelectric bender elements into a single piezoelectric unit. A single base member comprising a plurality of plates of piezoelectric material includes three or more electrodes for forming two or more bender elements. Preferred embodiments include one or more of the following: (i) electrodes for forming inactive regions near structure center and/or ends, (ii) aspects of structural symmetry aiding to establish preferred signal phase and amplitude relationships (iii) base member fashioned according to a three layer laminated structure (iv) circular base member (v) uniform plate polarization (vi) two or four substantially matched bender elements.

42 Claims, 13 Drawing Figures

SENSOR STRUCTURE INCORPORATING MULTIPLE PIEZOELECTRIC GENERATORS

The present invention relates to piezoelectric sensors and in the preferred embodiment to piezoelectric angular rate sensor apparatus suitable for generating, in response to Coriolis acceleration forces, a signal containing angular rate information.

The concept of deriving angular rate information from piezoelectric generating devices is well known in the art. Such sensor devices are generally rotated about an axis perpendicular to the angular rate or rates to be sensed, the form of rotation either being continuous (i.e., spinning) or vibratory (i.e., oscillating). See for example U.S. Pat. Nos. 2,716,893 and 3,842,681. Moreover, such devices conventionally comprise two separate and distinct piezoelectric bender elements, each being independently mounted to a rotatable driveshaft so as to be substantially perpendicular to, and on opposing sides of, the driveshaft, each bender element further being oriented for generating a signal in response to a bending force parallel to the axis of rotation. Some prior art vibratory devices use four separate and distinct benders each being independently mounted at substantially 90° intervals around the driveshaft.

Such devices exhibit deficiencies and problems which can make them unsuitable for some applications. For example, unacceptable differences in amplitude and/or phase between signals from the different bender elements may result if the individual bender elements are not electrically matched with one another or if the individual bender elements are not suitably aligned relative to one another and relative to the spin axis. These conditions can also result in contaminated signals because the device may not have an output stable with time and temperature and/or may not be immune to objectionable force components such as linear accelerations, vibrations and gravity, or such as vibration along the axis of rotation.

In accordance with the present invention, there is featured the provision of a piezoelectric sensor means which has improved characteristics in regard to the above identified problem areas. These and other features, objects, and advantages of the invention will become more apparent upon reference to the following specification, claims, and appended drawings in which:

FIG. 4b is a sectional view of the sensor apparatus of FIG. 4a;

FIGS. 5 through 8 are perspective views representing examples of alternative sensor embodiments and features also within the inventive principles herein;

Figure 1:
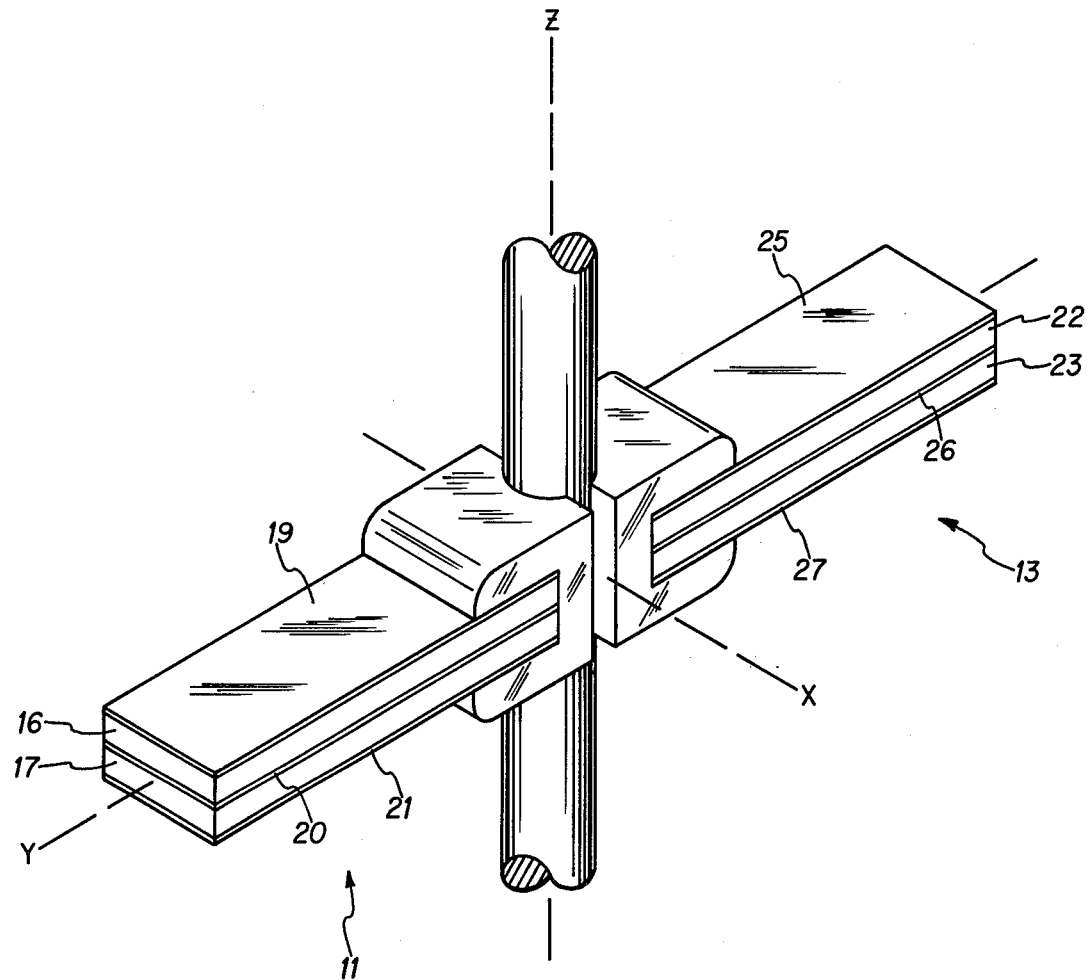
FIG. 1 is a perspective view of a typical prior art piezoelectric rate sensor device.

Referring now to FIG. 1, the typical prior art embodiment therein shown comprises two separate and distinct piezoelectric bender elements 11 and 13, each being secured at one end to an opposite side of a spinning driveshaft 15, and each having an outward projecting free end to permit up-down element bending in response to Coriolis forces as the assembly spins. Such cantilevered bender element 11 typically comprises two layers 16 and 17 of polarized piezoelectric material and also two electrodes 19 and 21 located on exterior major surfaces of layers 16 and 17. Also in the prior art, a metal layer or coating 20 is sandwiched between layers 16 and 17. Similarly, cantilevered element 13 typically comprises two layers 22 and 23 of polarized piezoelectric material and two electrodes 25 and 27 located on exterior major surfaces of layers 22 and 23. As in element 11, element 13 further includes a metal layer 26 interiorly disposed between layers 22 and 23. Voltages generated in active layers 16, 17, 22, and 23 are combined in various ways to provide useful output signals and eliminate undesired signals.

In the angular rate sensing mode, and as the assembly spins while experienceing an angular rate normal to the spin axis, one bender element tends to flex through repeated up-down-up cycles while the other tends to flex out of phase through down-up-down cycles. Thus, as part of the usually preferred situation, for the condition where a constant angular rate is experienced about a single axis perpendicular to the spin axis, the two signals at the two respective electrode pairs, namely pair 19-21 and pair 25-27, would both be sine waves having identical peak amplitudes and frequencies and being out of phase exactly 180°. As another part of the usually preferred case, the output signal between electrodes 19 and 25 would not reflect or be sensitive to forces parallel to the X-Y plane and would not on the average reflect reciprocating type vibrations of the shaft along the Z axis.

However, for several reasons, the FIG. 1 type of device has inherent deficiencies which can readily thwart accomplishment of these goals. For example, the two bender elements can have unmatched electrical characteristics due to a variety of factors. Such factors include (1) element-to-element differences in built-in stresses resulting from such things as variations in manufacturing conditions (2) element-to-element differences in sensitivity and temperature-dependence resulting from such things as batch-to-batch variations in materials (3) element-to-element differences in electrical characteristic changes with aging (4) element-to-element variations in polarization (5) element-to-element variations in the internal stresses resulting from different stresses imposed by the two independent mounts (6) non-repeatability of piezoelectric parameters within the same element due to temperature induced steady-state stresses in the mount regions. There is also the problem of improper alignment of the two bender elements relative to each other and relative to the driveshaft. Alignment is improper if (1) the two elements are not opposed suitably close to 180° or (2) either element is not aligned suitably close to normal with the Z axis or (3) either element is "twisted" so that its bending axis is not parallel with the Z axis.

electrically connected together so that the G3 and G4 electrode pairs operate in parallel. The G1-G2 combination is connected in series with the G3-G4 combination and the voltage $E_O$ between electrodes 41 and 42 is used as the output signal. Typically, slip rings (not shown) are used to carry the signal to utilizing circuitry which is stationary (i.e., not rotating).

In use as a rate sensor, as the sensor 30 experiences an angular rate perpendicular to the spin axis Z, a Coriolis acceleration force is exerted on all elements of the mass of the sensor means. The useful acceleration term is parallel to the spin axis. Thus, the output voltage $E_0$ is of the form $$E_O = K\theta N \cos Nt + K\psi N \sin Nt$$

where K is a sensitivity constant for the sensor and where N is the spin frequency in radians per second. $\theta$ represents the angular displacement or tilt of the spin axis in the Y-Z plane and $\psi$ represents the angular displacement or tilt of the spin axis in the X-Z plane. $\theta$ and $\psi$ are respectively $d\theta/dt$ and $d\psi/dt$ and thus are angular rates about axes perpendicular to the spin axis. In the utilizing circuitry, the output voltage $E_O$ is phase detected and measured to determine the desired rates $\theta$ and $\psi$.

Figure 3:
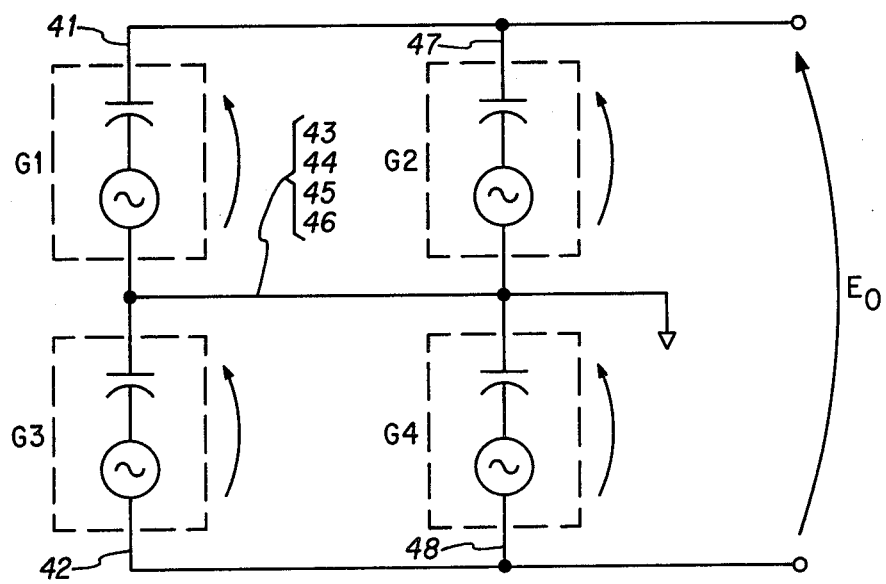
FIG. 3 is an equivalent circuit schematic representing the FIG. 2 apparatus and a preferred connection of the FIG. 2 sensor electrodes.

Connection of the electrodes according to FIG. 3 is suitable in preferred applications because the four generators G1, G2, G3, and G4 each generate a signal whose amplitude and phase are stable and predictable relative to the amplitude and phase of the other three signals. More particularly, both the G1 and G2 generated signals are AC signals whose electrical phase separation is substantially zero degrees and whose peak amplitudes are substantially equal. Also, both the G3 and G4 generated signals are AC signals whose electrical phase separation is substantially zero and whose peak amplitudes are substantially equal. Moreover, when the same Coriolis force magnitude is being sensed, the G1 and G3 generated AC signals are substantially equal in peak amplitude and are separated in electrical phase by substantially 180°. The various symmetrics of the sensor structure and its electrodes and plates contribute significantly toward the producing of these presentaly preferred amplitude and phase relationships. These and other amplitude and phase relationships can also be achieved, for example, through different placement and/or configuration of electrodes. Such other relationships also find useful application since they are stable and determinable. Also, as will be seen from further description and explanations herein, bidirectional polarization can be employed in such a way that all four signals will be in-phase, i.e., separated in electrical phase by substantially 0°.

Figure 2:
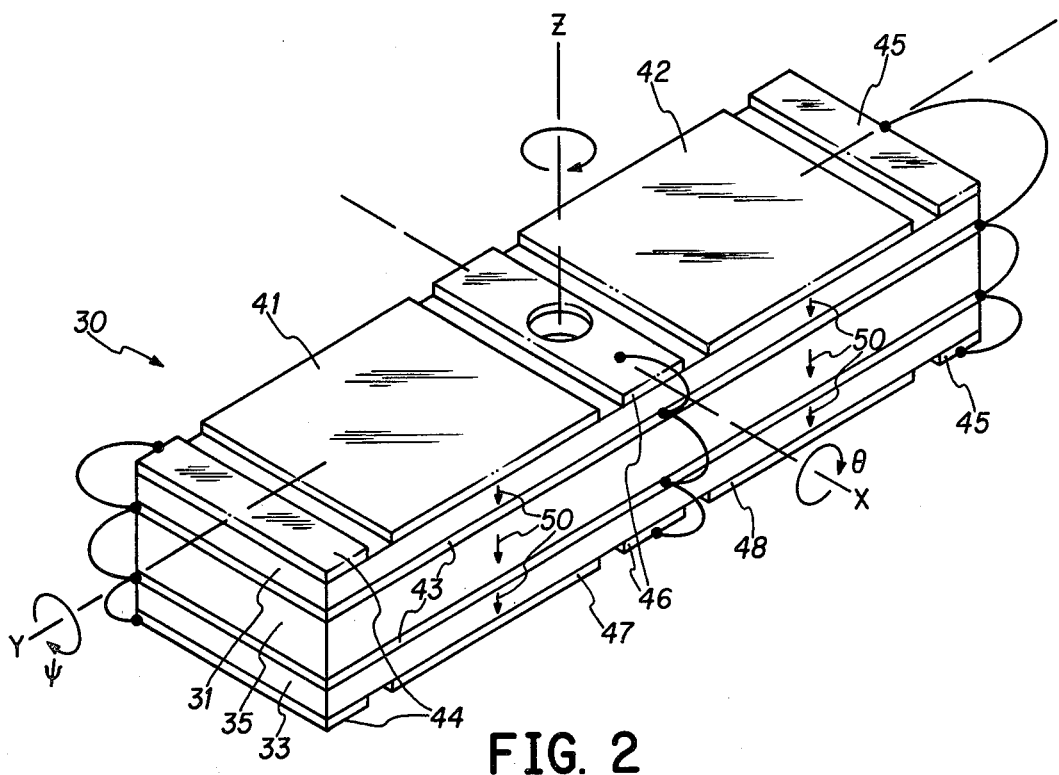
FIG. 2 is a perspective view of a piezoelectric sensor embodiment incorporating many of the presently preferred features.
Figure 4A:
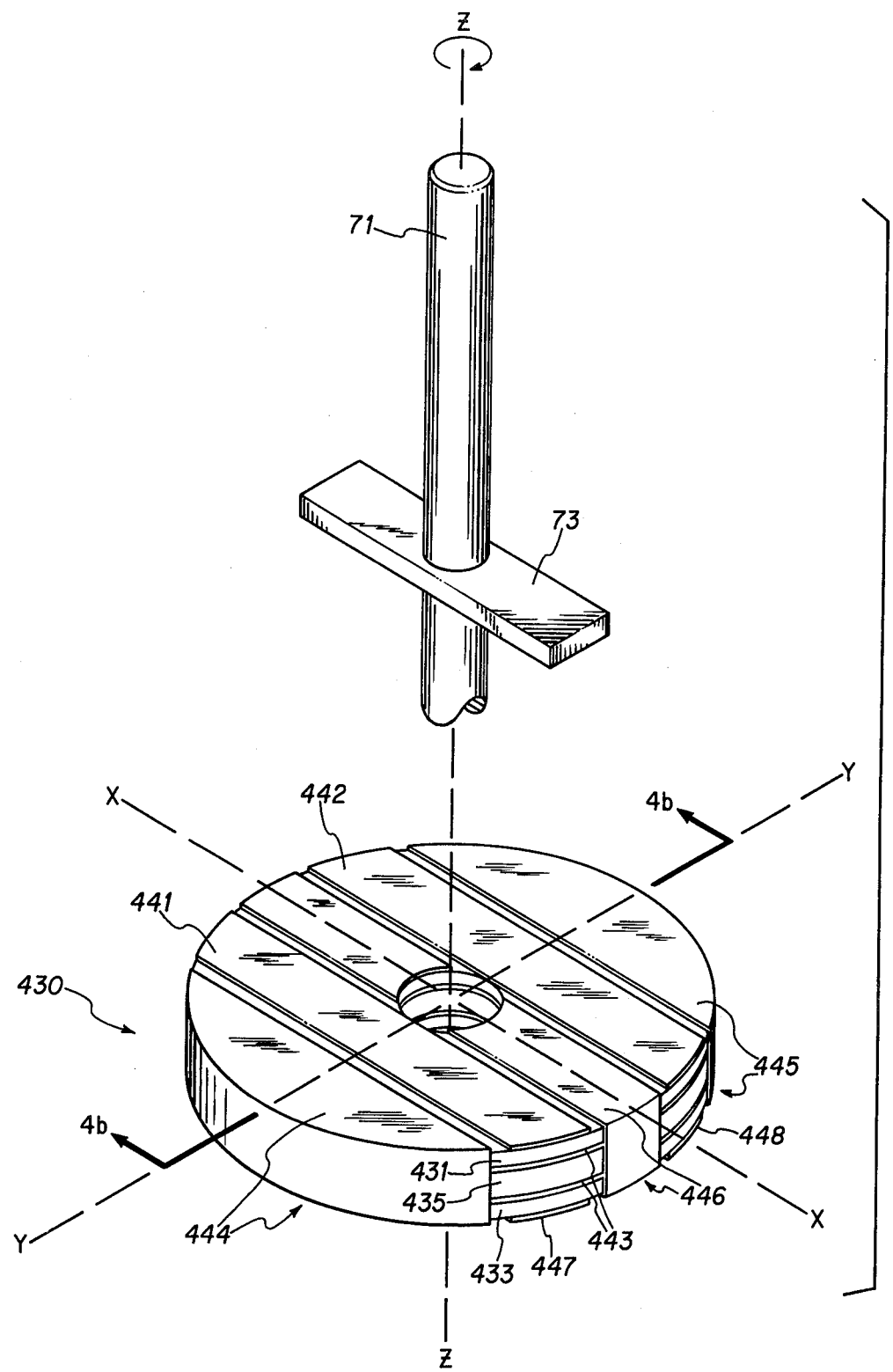
FIG. 4a is a perspective view representing the presently preferred inventive embodiment.

Turning now to FIG. 4a, the presently preferred embodiment 430 represented therein is constructed the same as the FIG. 2 embodiment with the basic exception that one is a circular or disc-shaped embodiment and the other is a rectangular or box-shaped embodiment. More particularly, the FIG. 4a embodiment 430 is a laminated structure comprising three flat piezoelectric plates 431, 433, and 435 which correspond directly in function to, respectively, plates 31, 33, and 35 in FIG. 2. The three plates 431, 433, and 435 are each uniformly polarized in a downward direction normal to the major surfaces. Also, the FIG. 4a embodiment includes first through eighth electrodes namely 441, 442, 443, 444, 445, 446, 447, and 448, which correspond directly in function and generally in location to, respectively, the eight FIG. 2 electrodes namely 41, 42, 43, 44, 45, 46, 47, and 48. The third electrode 443 in FIG. 4a is again interiorly disposed, having a part between plates 31 and 35 and another part between plates 33 and 35. Symmetries about the Y-Z plane of all electrodes are maintained. Symmetries among the first, second, seventh and eighth electrodes are maintained. Symmetry of the sixth electrode relative to the X-Z plane is maintained. The first, second, seventh, and eighth electrodes are maintained as the active electrodes, and the third, fourth, fifth, and sixth electrodes are again electrically connected together and act as points of a common potential. Inactive regions are again created at the central and end regions by the fourth, fifth, and sixth electrodes. As to differences, in the FIG. 4a embodiment 430 the piezoelectric plates 431, 433, and 435 are circular whereas the corresponding plates 31, 33, and 35 respectively, in the FIG. 2 embodiment 30 are rectangular. Also, in the FIG. 4a embodiment 430 the major surface areas contacted by the first, second, fourth, fifth, sixth, seventh, and eighth electrodes are bounded by various chords and arcs of the plate-defined circle, whereas in the FIG. 2 embodiment 30 the major surface areas contacted by these corresponding electrodes are bounded by the perimeters of various rectangles. Also, in the FIG. 4a embodiment, the upper and lower parts of the fourth electrode 444 are electrically connected together and also to the third electrode 443 by edge plating rather than by wires as represented in FIG. 2. Likewise for the upper and lower parts of the fifth electrode 445 and the upper and lower parts of the sixth electrode 446.

When in use as an angular rate sensor, the FIG. 4a sensor 430 is secured to a Z-axis-aligned spinnable shaft 71 via appropriate attachment of the sixth electrode 446 to a shaft-mounted cross member 73. Typical attachment is effected by soldering or adhesive bonding. It is of course desirable to maintain isolation between the active region electrodes and the driveshaft.

It is thus seen that the embodiments 30 and 430 are identical in concept and in principle of operation. However, the circular embodiment 430 is presently preferred because it offers increased efficiency and/or sensitivity when for a particular application it is desired that the maximum major surface dimension be restricted and small.

Either of the embodiments 30 or 430 may be formed as a monolithic structure. This involves drying a slurry of dielectric material into thin flat sheets, electroding the sheets, cutting the electroded green sheets to the desired shape, stacking the cut parts into a laminated structure, and then firing, poling, and cooling the structure. Alternatively, the embodiments may be constructed by bonding together preformed and electroded piezoceramic plates. In either case, completion of the desired electrode configurations may be achieved by applying electrode paste or paint, or removing, either chemically or mechanically, previously deposited electrode material. The manufacture of these embodiments is presently the same as described in my U.S. Pat. application Ser. No. 276,112 entitled "Piezoelectric Sensor" and assigned to the assignee hereof, said application also showing in its drawing a three layer piezoelectric device having interior and exterior electrodes. Said application elaborates further on certain details including device manufacture. Thus, for a more complete presentation, the teachings of said application Ser. No. 276,112 is hereby incorporated by reference into the present disclosure. The primary additional manufacturing step used to produce the embodiments 30 and 430 is to form the shaft-accomodating through-hole either mechanically or chemically. Of course, the hole may be omitted in some embodiments, such as those where the sensor means may be located at the end of the shaft.

It should also be noted that the uniformity of polarization of the piezoelectric material is an important aspect of the presently preferred embodiments. Internal stresses in the structure at extreme temperatures are minimized when the piezoelectric material is uniformly polarized. Accordingly, during manufacture, it is preferred that the exterior surface electrode configurations be established or altered after the piezoelectric material is poled in order to achieve uniformity of polarization at locations such as the fourth, fifth, and sixth electrode regions and also at locations such as the isolation gaps between electrodes associated with the active regions and electrodes associated with the inactive regions.

It should also be noted that the electrode arrangement of embodiments 30 and 430 electrically isolates a substantial portion of the end and central regions of each sensor apparatus, making the end regions and the central region inactive in the circuit and thus providing functional and/or structural symmetry and increased sensitivity and stability of the sensor means. More particularly, prior art piezoelectric sensors are typically bonded to or clamped in rigid mounting members. Because the piezoelectric parameters vary with steady-state stress, and because steady-state stress in the base or mount region of a sensor can change with temperature, it is preferred to virtually eliminate the signal developed in the mount region from the output signal of the sensor means, thereby improving long-term stability and repeatability of scale factor and impedance of the sensor means. In addition, changes in the elastic modulus of the bonding material at the interface change the distribution of stresses in the mount area of the bender element which in turn can change the effective length of the bender elements and thus affect scale factor. By removing the mount region from the active sensor regions, the effective length of the bender elements is more nearly defined by the configuration of the active electrode plating and is less influenced by variable strains in the mount and sensor-to-mount bond.

Figure 4B:
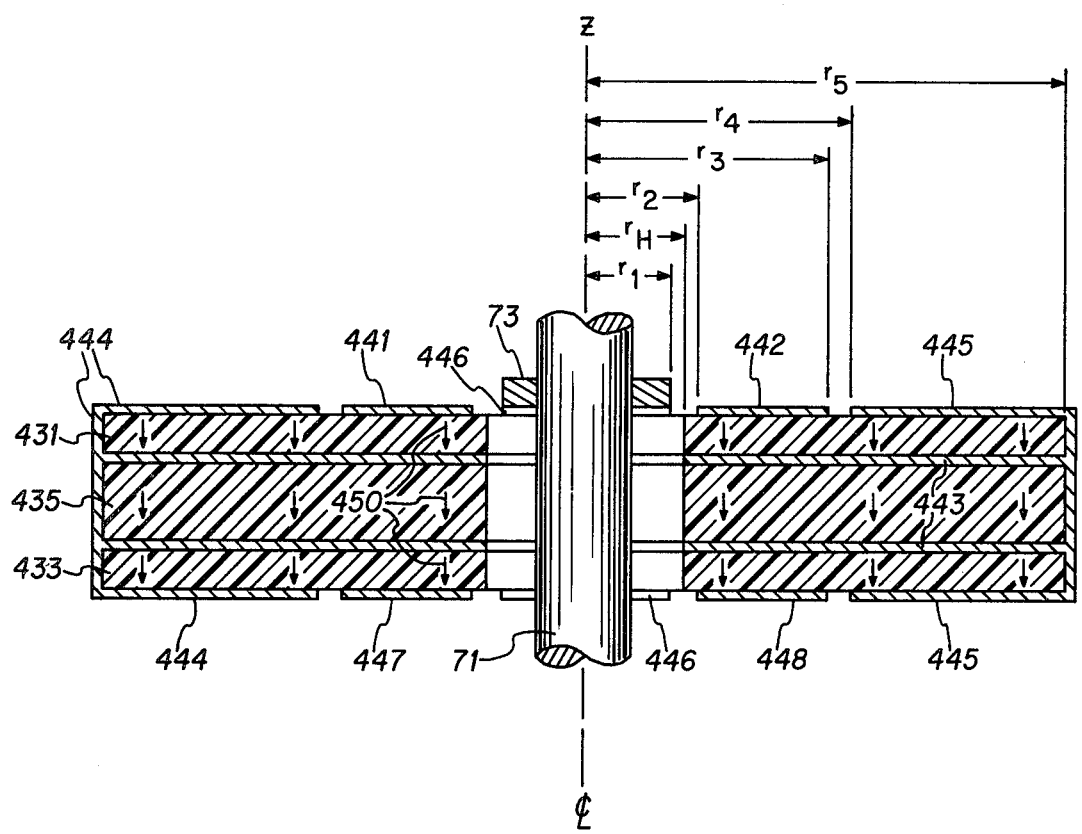

Turning now to FIG. 4b, therein is shown a sectional view of sensor 430 taken along the line 4b—4b of FIG. 4a. Typical presently preferred values (in inches) for the FIG. 4b-defined dimensions are as follows: $r_1=0.075$, $r_2=0.105$, $r_3=0.25$, $r_4=0.28$, $r_5=0.5$, $r_H=0.10$, thickness, of plate 431=thickness of plate 433=0.01, thickness of plate 435=0.02. As indicated hereinabove, the sensor 430 is substantially symmetric about the X-Z plane and thus the various "r" dimensions and values are left-right symmetric about the center line in FIG. 4b. Electrode thickness is quite small and is exaggerated in all drawings for clarity of presentation. Typically, the thickness of each part of interior electrode 443 is less than 0.0005 inches. Also, typically, the thickness of each of the exterior electrodes is less than 0.001 inches. As also indicated hereinabove, each plate of sensor 430 is uniformly polarized downwardly and normal to the major surfaces. Such polarization is represented by the arrows in FIG. 4b.

As should now be apparent, the inventive principles herein may be variously embodied. FIGS. 5 through 11 represent embodiments which are exemplary of such alternatives. Each illustrated alternative includes three or more electrodes arranged on a base member of two or more piezoelectric plates. Many of the electrode and plate components in the FIGS. 5, 6, 7, and 8 embodiments correspond in function to similar electrode and plate components in the FIGS. 2 and 4a embodiments. To indicate such correspondence, each three digit numerical designator assigned to a component in FIGS. 5 through 8 uses the figure number as its most significant digit and uses as its least significant two digits the same two digit designator assigned to the corresponding component in FIG. 2. A similar scheme of designation was employed in FIGS. 4a and b.

Figure 5:
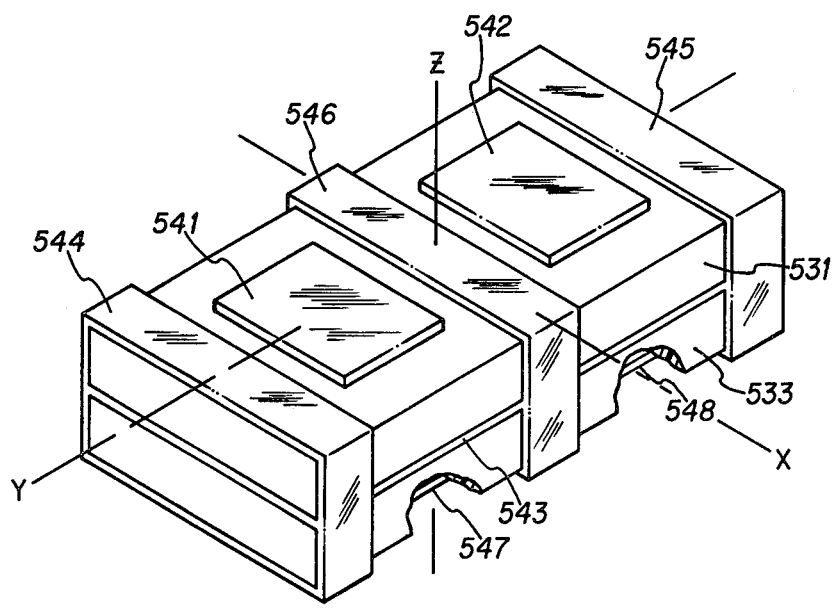

Turning now to FIG. 5, therein is represented an embodiment which indicates that laminated embodiments using only two piezoelectric plates may be realized. The FIG. 5 embodiment includes first through eighth electrodes, namely, 541, 542, 543, 544, 545, 546, 547, and 548, and a laminated structure comprising two uniformly polarized piezoelectric plates 531 and 533. The third electrode 543 is sandwiched between plates 531 and 533.

Turning now to FIG. 6, therein is represented an embodiment employing two piezoelectric plates 631 and 633, and only first, second, and third electrodes 641, 642, and 643. FIG. 6 thus indicates that for some applications, a suitable embodiment need not include the shorted, inactive regions near the ends and the center.

The FIG. 7 apparatus, quite similarly to the FIG. 6 apparatus, employs two piezoelectric plates 731 and 733, and first, second, and third electrodes 741, 742, and 743. In FIG. 7 however, the first and second electrodes 741 and 742 are located to contact different exterior major surfaces of the plates 731 and 733. The third electrode 743 is interiorly disposed between plate 731 and plate 733 so as to contact same in areas suitable to maintain the formation of a first electrode pair and a second electrode pair.

Figure 8:
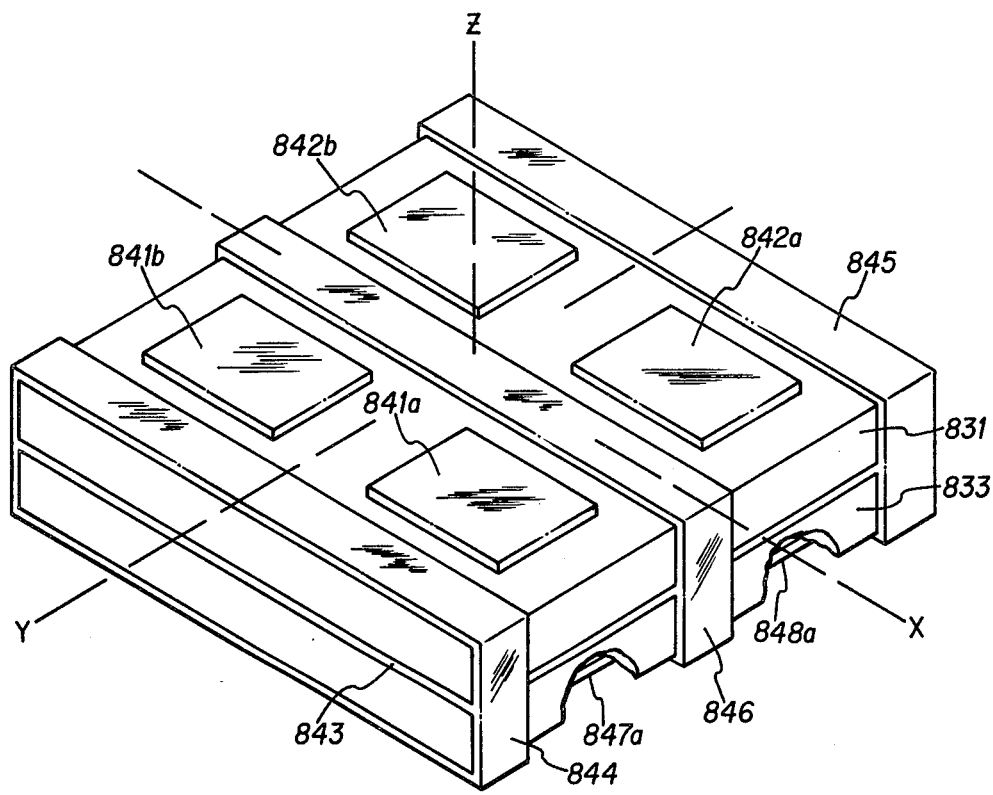

FIG. 8 illustrates an alternative embodiment featuring more than two active electrodes on either or both exterior major surfaces. More particularly, FIG. 8 represents an embodiment quite similar to a wider or squarer version of the FIG. 5 apparatus which has been further modified to divide each one of the four active electrodes into two active electrodes. The resulting FIG. 8 apparatus this has eight active electrodes, namely, 841a, 841b, 842a, 842b, 847a, 847b, 848a, and 848b. Electrodes 847b, and 848b, not seen in FIG. 8, reside on the underside of plate 833 beneath, respectively, electrodes 841b and 842b. Each a-b pair could be interconnected to serve as a single electrode, the result being a FIG. 5 type of apparatus with only four electrically distinct generators. It is contemplated as preferable, however, to bring out the signal from each of the eight active electrodes and thus maintain eight distinct generators. Further, it is contemplated that for some applications, either one of electrodes 841a or 841b could serve by itself and without connection to the other as a "first electrode", that is, one analogous to the first electrode of FIGS. 2, 4a, or 5. Likewise, either one of 842a or 842b could serve by itself and without connection to the other as a "second electrode". Similarly for 847a, 847b, 848a, and 848b when they are employed. The FIG. 8 type of apparatus could thus be employed, for example, to effect additional redundancy.

Figure 9:
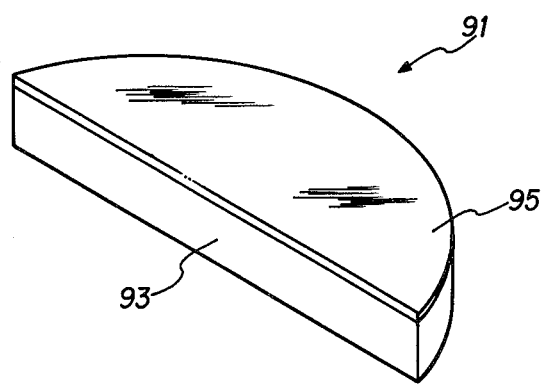
FIG. 9 is a perspective view representing a part which may be added to the FIG. 4a, 4b apparatus, thereby resulting in another alternative embodiment.

FIG. 9 represents a small weight 91 whose configuration and makeup make it particularly suitable for adding mass at the ends of the sensor 430. More particularly, weight 91 comprises a single flat piezoelectric layer 93 which preferably bears, on at least one major surface, an electrode or metal layer 95. The shape of the weight 91 is generally that of a minor segment of a circle and, more particularly, matches the shape and size of the top and bottom portions of electrode 444 (and also 445) of sensor 430 illustrated in FIG. 4a.

Figure 10:
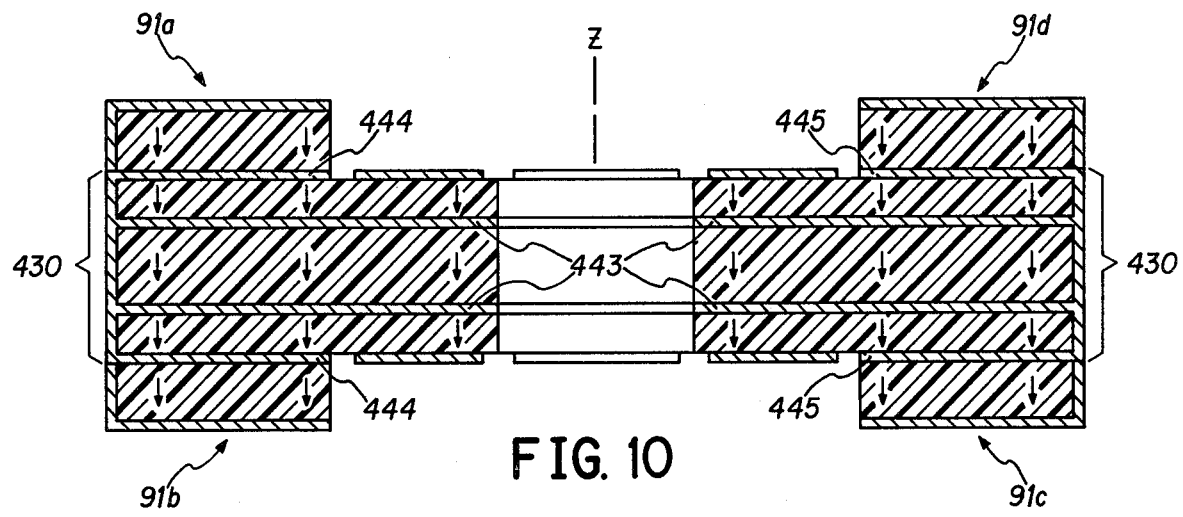
FIG. 10 is a sectional view representing the alternative embodiment achieved by adding the FIG. 9 apparatus to the FIG. 4a, 4b appartus.

Four of the weights 91, namely, 91a, 91b, 91c, and 91d, may be added to sensor 430 as illustrated in FIG. 10. Typically, the four weights are bonded to electrodes 444 and 445 (both top and bottom portions thereof) with solder or adhesive. (Note that the FIG. 10 sectional view of sensor 430 is from the same aspect as FIG. 4b.)

It is contemplated as preferable that the four weights also be uniformly polarized normal to major surfaces as illustrated in FIG. 10. It is further contemplated as preferable as illustrated in FIG. 10 that both major surfaces of the weights be electrically connected via edge plating to the interior electrode 443. A typical thickness of weight 91 is about half the thickness of sensor 430. Alternatively the weights could be made from suitable metal preferrably matched in temperature coefficient with the ceramic.

Figure 11A:
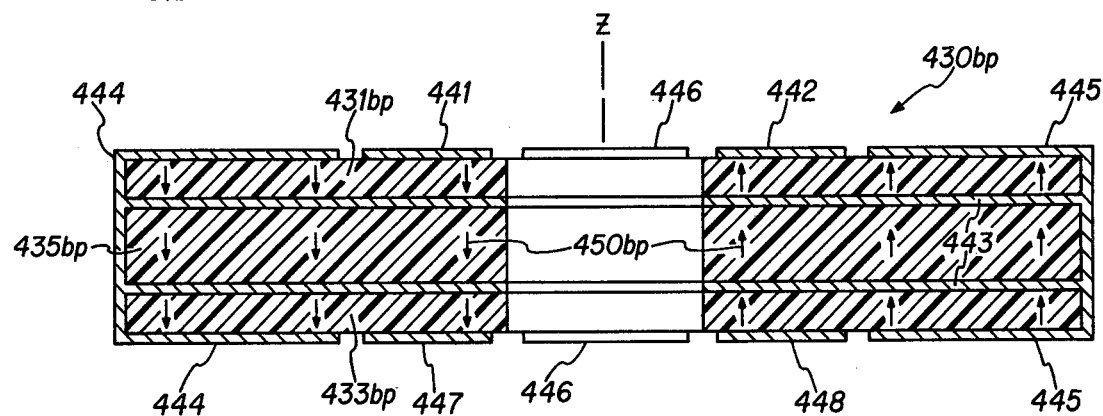
FIG. 11a is a sectional view representing another alternative modification of the FIG. 4a, 4b apparatus.

Turning now to FIG. 11a, therein is represented a further alternative which indicates that another mode of polarization may be employed for the embodiments herein. More particularly, FIG. 11a represents a sensor 430bp which, except for polarization of the three individual piezoelectric plates, is identical to the sensor 430 shown in FIGS. 4a and 4b. (Note that the FIG. 11a sectional view of the sensor is from the same aspect as FIG. 4b.) Like the three piezoelectric plates of sensor 430 in FIG. 4b, each individual one of the three plates of sensor 430bp is still uniformly polarized normal to its major surfaces. However, whereas the three plates of the FIG. 4b sensor 430 are each unidirectionally polarized, each of the three plates of sensor 430bp is bidirectionally polarized. More particularly, the portions of plates 431bp, 433bp, and 435bp lying on one side of the X-Z plane are uniformly polarized upwardly, and the portions of plates 431bp, 433bp, and 435bp lying on the other side of the X-Z plane are uniformly polarized downwardly. Such polarization is represented by arrows 450bp. There is of course a polarization discontinuity in the central inactive region along the X axis but the FIG. 11a polarization is nevertheless considered uniform for purposes of definition herein.

Figure 11B:
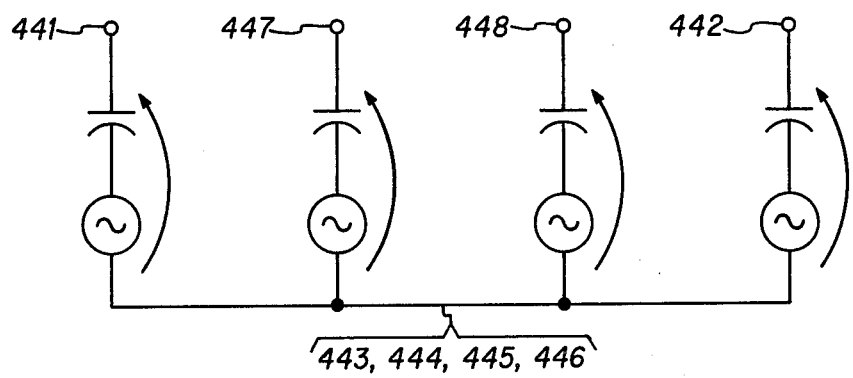
FIG. 11b is an equivalent circuit schematic representing the FIG. 11a apparatus.

One advantage of the polarization shown in FIG. 11a is that for rate measuring applications, all of the voltages generated at electrodes 441, 447, 448, and 442 with respect to the common electrode 443 are in-phase since the left-hand side of the FIG. 11a apparatus is strained oppositely from the right-hand side due to the coriolis accelerations. FIG. 11b, which is an equivalent circuit schematic of the FIG. 11a apparatus, indicates such phase relationship with arrows. Having the voltages nominally in-phase with respect to a common electrode that may also be connected to the support structure is advantageous in some signal processing applications.

It of course will be apparent to those skilled in the art that suitable combinations of the above described individual variations and modifications will yield additional variations and modifications, and also that the variations and modifications herein presented are not exhaustive of those within the scope of the present invention.

The various disclosed features are thus seen to afford improvement in the areas of (i) matching electrical characteristics of a plurality of unmounted and shaft-mounted bender elements, (ii) mechanically aligning a plurality of bender elements relative to one another and relative to a driveshaft, and (iii) electrical accuracy, sensitivity, and stability of bender elements. Each structure is built on a single base comprising a plurality of plates arranged according to a laminated structure. Being built on such a single base, electrical parameters and characteristics of the different benders in a unit are more nearly matched than typical prior art discrete-component type benders. That is, each bender of a unit originates at the same time from the same batch of materials and under the same manufacturing conditions. Furthermore, the highly preferred feature of uniform polarity can be more nearly realized. Furthermore, being built on such a single base, appropriate mechanical alignment of benders is stable and accurate. About the only misalignment which can occur in mounting one of the multiple bender sensors to the driveshaft is the misalignment wherein the sensor is secured so that the major surfaces are not exactly perpendicular to the driveshaft. Even then however, the opposing benders are still substantially parallel and on the average cancel out effects of forces normal to the spin axis. Furthermore, additional stability of electrical characteristics is afforded in the preferred embodiments by the end and central inactive regions. Also, even further electrical stability is afforded in the preferred embodiments by the three-layer laminated structure.

Thus, while various embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

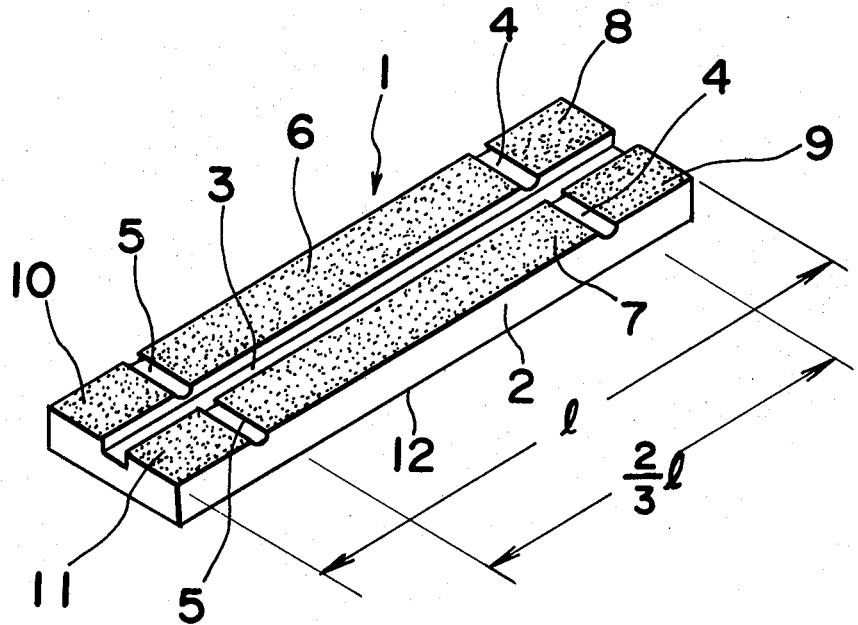

What is claimed is:

1. Sensor means comprising:
a plurality N of flat plates of piezoelectric material, each said plate having two opposing major surfaces, said plates being arranged according to a laminated structure, and first, second, and third electrodes located on predetermined major surfaces, said first and third electrodes located to contact opposite major surfaces of a predetermined one of said plates so as to form a first signal-generating electrode pair, said second and third electrodes located to contact opposite major surfaces of a predetermined one of said plates so as to form a second signal-generating electrode pair, said first electrode and said second electrode being configured and located such that, relative to a reference axis perpendicular to the major surfaces, the first and second electrodes are angularly displaced from one another by a non-zero amount, and a further electrode EM located between said first and second electrodes and having at least a portion located on the same major surface as is contacted by at least one of the first and second electrodes, said further electrode EM being electrically isolated from both the first and second electrodes and being electrically shorted to said third electrode.

2. Sensor means comprising:
a plurality N of flat plates of piezoelectric material, each said plate having two opposing major surfaces, said plates being arranged according to a laminated structure, and first, second, and third electrodes located on predetermined major surfaces, said first and third electrodes located to contact opposite major surfaces of a predetermined one of said plates so as to form a first electrode pair, said second and third electrodes located to contact opposite major surfaces of a predetermied one of said plates so as to form a second electrode pair, said first electrode and said second electrode being configured and located such that, relative to a reference axis perpendicular to the major surfaces, the first and second electrodes are angularly displaced from one another by a non-zero amount, said first and second electrode pairs being located and configured such that when the following conditions is imposed, namely, when (i) said plates are appropriately polarized and (ii) the sensor means is rotated at a predetermined frequency $f_s$ about the reference axis and (iii) the sensor means experiences a movement such that the reference axis tilts at a constant angular rate away from a previous orientation, then said first and second electrode pairs will generate, respectively, first and second AC signals which will (a) have the same frequency $f_s$, and (b) have peak amplitudes whose ratio will be substantially constant.

3. Sensor means as defined in claim 2 wherein the peak amplitude ratio will be substantially one.

4. Sensor means comprising:

a plurality N of flat plates of piezoelectric material, each said plate having two opposing major surfaces, said plates being arranged according to a laminated structure, and first, second, and third electrodes located on predetermined major surfaces, said first and third electrodes located to contact opposite major surfaces of a predetermined one of said plates so as to form a first electrode pair, said second and third electrodes located to contact opposite major surfaces of a predetermined one of said plates so as to form a second electrode pair, said first electrode and said second electrode being configured and located such that, relative to a reference axis perpendicular to the major surfaces, the first and second electrodes are angularly displaced from one another by a non-zero amount, said first and second electrode pairs being located and configured such that when the following condition is imposed, namely, when (i) said plates are appropriately polarized and (ii) the sensor means is rotated at a predetermined frequency $f_s$ about the reference axis and (iii) the sensor means experiences a movement such that the references axis tilts at a constant angular rate away from a previous orientation, then said first and second electrode pairs will generate, respectively, first and second AC signals which will (a) have the same frequency $f_s$, and (b) differ in phase by a predetermined one of substantially 0° or substantially 180°.

5. Sensor means as defined in claim 4 wherein said first and second electrode pairs are located on opposite sides of said reference axis.

6. Sensor means as defined in claim 5 wherein N equals a predetermined one of 2 or 3.

7. Sensor means definable relative to a coordinate system having three mutually perpendicular axes designated as X, Y, and Z, said sensor means comprising:

a plurality N of flat circular plates of piezoelectric material, each said plate having two opposing circular major surfaces normal to, and centered about, said Z axis, said plates being arranged according to a laminated structure and each said plate being uniformly polarized normal to its major surfaces, each said circular plate being configured such that the piezoelectric material thereof continuously extends full circle around the Z axis and first, second, and third electrodes located on predetermined major surfaces, said first and second electrodes located on one major surface of a predetermined plate designated as P1 and further located so as to be on opposite sides of the X-Z plane, at least part of said third electrode being configured and located to contact the opposite major surface of plate P1 so as to form, in conjunction with said first and second electrodes, first and second signal-generating electrode parts respectively, and a first additional electrode located between said first and second electrodes, said first additional electrode being located and configured to be electrically isolated from said first and second electrodes and to cause a predetermined portion of the major surface contacted by the first electrode to be shorted to said third electrode.

8. Sensor means as defined in claims 2, 3, 4, 5, or 6 wherein said first and second electrodes are located to contact the same major surface.

9. Sensor means as defined in claims 2, 3, 4, 5, or 6 wherein each of said plates is uniformly polarized normal to its major surfaces.

10. Sensor means as defined in claims 2, 3, 4, 5 or 6 wherein there are first and second external piezoelectric plates arranged according to the laminated structure, and at least part of the third electrode is located between said first and second external plates.

11. Sensor means as defined in claim 10 wherein N is equal to 3 such that there is one internal piezoelectric plate arranged according to the laminated structure between said first and second external plates, and at least part of the third electrode is located to contact both major surfaces of the internal plate.

12. Sensor means as defined in claim 2 wherein, relative to coordinate system having (i) a Z axis which is the same as said reference axis (ii) an X axis perpendicular to said Z axis and (iii) a Y axis perpendicular to both said Z and X axes, said first and second electrodes are located and configured on opposite sides of the X-Z plane and such that when their two individual areas of contact with major surfaces are each projected along the Z axis into the X-Y plane, said projected areas of contact are substantially symmetric with one another about the X-Z plane.

13. Sensor means as defined in claim 2 wherein, relative to coordinate system having (i) a Z axis which is the same as said reference axis (ii) an X axis perpendicular to said Z axis and (iii) a Y axis perpendicular to both said Z and X axes, said first and second electrodes are located on opposite sides of the X-Z plane, and further, said first electrode is located and configured such that in the plane of the major surface on which the first electrode is located said first electrode is substantially symmetric about the Y-Z plane, and further, said second electrode is located and configured such that in the plane of the major surface on which the second electrode is located the second electrode is substantially symmetric about the Y-Z plane.

14. Sensor means as defined in claim 2 wherein, relative to coordinate system having (i) a Z axis which is the same as said reference axis (ii) an X axis perpendicular to said Z axis and (iii) a Y axis perpendicular to both said Z and X axes, (a) said first and second electrodes are located and configured on opposite sides of the X-Z plane and such that when their two individual areas of contact with major surfaces are each projected along the Z axis into the X-Y plane, said projected areas of contact are symmetric with one another about the X-Z plane, (b) said first electrode is further located and configured such that in the plane of the major surface on which the first electrode is located said first electrode is substantially symmetric about the Y-Z plane, and (c) said second electrode is further located and configured such that in the plane of the major surface on which the second electrode is located the second electrode is substantially symmetric about the Y-Z plane.

15. Sensor means as defined in claim 14 wherein each of said plates is substantially symmetric about the Y-Z plane and also substantially symmetric about the X-Z plane.

16. Sensor means comprising:
   a plurality N of flat plates of piezoelectric material, each said plate having two opposing major surfaces, said plates being arranged according to a laminated structure, and
   first, second, and third electrodes located on predetermined major surfaces, said first and third electrodes located to contact opposite major surfaces of a predetermined one of said plates so as to form a first electrode pair, said second and third electrodes located to contact opposite major surfaces of a predetermined one of said plates so as to form a second electrode pair, said first electrode and said second electrode being configured and located such that, relative to a reference axis perpendicular to the major surfaces, the first and second electrodes are angularly displaced from one another by a non-zero amount, and
   a fourth electrode located on the same side of the reference axis as the first electrode but at a greater distance from the reference axis than the first electrode, said fourth electrode having at least a portion located on the same major surface as is contacted by the first electrode, said fourth electrode being electrically isolated from both the first and second electrodes, and said fourth electrode being electrically connected to said third electrode.

17. Sensor means as defined in claim 16 and further including a fifth electrode located on the same side of the reference axis as the second electrode but at a greater distance from the reference axis than the second electrode, said fifth electrode having at least a portion located on the same major surface as is contacted by the second electrode, said fifth electrode being electrically isolated from both the first and second electrodes and said fifth electrode being electrically connected to said third electrode.

18. Sensor means as defined in claim 17 including a further electrode EM located between said first and second electrodes and having at least a portion located on the same major surface as is contacted by at least one of the first and second electrodes, said further electrode EM being electrically isolated from both the first and second electrodes and being electrically connected to said third electrode.

19. Sensor means as defined in claim 18 or 1 wherein there are first and second external plates arranged according to the laminated structure, and the first and second electrodes are located to contact the external major surface of said first external plate, and wherein said sensor means includes two further electrodes EB1 and EB2, said electrode EB1 being configured and located to serve substantially a duplicate function of said first electrode but being located on the external major surface of said second external plate, said electrode EB2 being configured and located to serve substantially a duplicate function of said second electrode but being located on the external major surface of said second external plate.

20. Sensor means as defined in claim 19 wherein, relative to coordinate system having (i) a Z axis which is the same as said reference axis (ii) an X axis perpendicular to said Z axis and (iii) a Y axis perpendicular to both said Z and X axes, (a) said first and second electrodes are located and configured on opposite sides of the X-Z plane and such that when their two individual areas of contact with major surfaces are each projected along the Z axis into the X-Y plane, said projected areas of contact are symmetric with one another about the X-Z plane, (b) said first electrode is further located and configured such that in the plane of the major surface on which the first electrode is located said first electrode is substantially symmetric about said Y-Z plane, and (c) said second electrode is further located and configured such that in the plane of the major surface on which the second electrode is located the second electrode is substantially symmetric about said Y-Z plane.

21. Sensor means definable relative to a coordinate system having three mutually perpendicular axes designated as X, Y, and Z, said sensor means comprising:
   a plurality N of flat circular plates of piezoelectric material, each said plate having two opposing circular major surfaces normal to, and centered about, said Z axis, said plates being arranged according to a laminated structure and each said plate being uniformly polarized normal to its major surfaces, each said circular plate being configured such that the piezoelectric material thereof continuously extends full circle around the Z axis, and
   first, second, and third electrodes located on predetermined major surfaces, said first and second electrodes located on one major surface of a predetermined plate designated as P1 and further located so as to be on opposite sides of the X-Z plane, at least part of said third electrode being configured and located to contact the opposite major surface of plate P1 so as to form, in conjunction with said first and second electrodes, first and second electrode pairs respectively.

22. Sensor means as defined in claim 21 wherein the major surface area of plate P1 contacted by said third electrode is coextensive with at least the major surface areas contacted by the first and second electrodes.

23. Sensor means as defined in claim 21 wherein said first and second electrodes are located and configured such that the two areas of the major surface contacted by said first and second electrodes are substantially symmetric with one another about the X-Z plane.

24. Sensor means as defined in claim 23 wherein said first electrode is further located and configured such that the area of the major surface contacted by said first electrode is substantially symmetric about the Y-Z plane, and wherein said second electrode is further located and configured such that the area of the major surface contacted by said second electrode is substantially symmetric about the Y-Z plane.

25. Sensor means as defined in claim 24 wherein the major surface area contacted by said first electrode has first and second substantially linear sides, said first linear side being substantially symmetric about the Y-Z plane, and said second linear side being substantially symmetric about the Y-Z plane.

26. Sensor means definable relative to a coordinate system having three mutually perpendicular axes designated as X, Y, and Z, said sensor means comprising:
a plurality N of flat circular plates of piezoelectric material, each said plate having two opposing circular major surfaces normal to, and centered about, said Z axis, said plates being arranged according to a laminated structure and each said plate being uniformly polarized normal to its major surfaces, and
first, second, and third electrodes located on predetermined major surfaces, said first and second electrodes located on one major surface of a predetermined plate designated as P1 and further located so as to be on opposite sides of the X-Z plane, at least part of said third electrode being configured and located to contact the opposite major surface of plate P1 so as to form, in conjunction with said first and second electrodes, first and second electrode pairs respectively, and
a fourth electrode located on the same side of the X-Z plane as the first electrode but at a greater distance from the X-Z plane than the first electrode, said fourth electrode being further located and configured to be electrically isolated from said first electrode and to cause a predetermined portion of the major surface contacted by the first electrode to be shorted to said third electrode, and further including a fifth electrode located and configured on the same side of the X-Z plane as the second electrode but at a greater distance from the X-Z plane than the second electrode, said fifth electrode further being located and configured to be electrically isolated from said second electrode and to cause a predetermined portion of the major surface contacted by the second electrode to be shorted to said third electrode.

27. Sensor means as defined in claim 26 wherein the major surface areas contacted by said fourth and fifth electrodes are substantially symmetric with one another about the X-Z plane.

28. Sensor means as defined in claim 27 wherein the individual major surface areas contacted by said fourth and fifth electrodes are each substantially symmetric about the Y-Z plane.

29. Sensor means as defined in claim 28 and further including first and second substantially equal weights attached to, respectively, said fourth and fifth electrodes.

30. Sensor means as defined in claim 29 wherein said first weight comprises a first flat section of polarized piezoelectric material having a predetermined shape, and said second weight comprises a second flat section of polarized piezoelectric material having a predetermined shape.

31. Sensor means as defined in claim 30 wherein said first and second weights are shaped to be substantially congruent with major surface areas contacted by, respectively, said fourth and fifth electrodes.

32. Sensor means as defined in claim 28 wherein the major surface area of plate P1 which is contacted by the fourth electrode is bounded on one side by a chord of a circle, said chord being parallel to the X axis.

33. Sensor means as defined in claim 26 and including a first additional electrode located between said first and second electrodes, said first additional electrode being located and configured to be electrically isolated from said first and second electrodes and to cause a predetermined portion of the major surface contacted by the first electrode to be shorted to said third electrode.

34. Sensor means as defined in claim 33 or 7 wherein the major surface area contacted by said first additional electrode is substantially symmetric about the X-Z plane and is also substantially symmetric about the Y-Z plane.

35. Sensor means as defined in claim 34 wherein the major surface area of plate P1 which is contacted by said first additional electrode is substantially bounded on two sides by two different chords of a circle, both said chords being parallel to, and on different sides of, the X axis.

36. Sensor means as defined in claim 33 or 7 wherein there are two external plates P1 and P2 arranged according to the laminated structure and wherein said sensor means includes a second additional electrode and a third additional electrode, said second additional electrode being located and configured on the external major surface of plate P2 such that the major surface areas contacted by the first electrode and the second additional electrode are substantially mirror images of one another about a plane parallel to the X-Y plane, said third additional electrode being located and configured on the external major surface of plate P2 such that the major surface areas contacted by the second electrode and the third additional electrode are substantially mirror images of one another about a plane parallel to the X-Y plane.

37. Sensor means as defined in claim 36 wherein all said electrodes identified as something other than first, second, third, second additional, or third additional, each have portions located on the external surface of plate P2 such that their respective plate P2 contact areas are substantially mirror images of their respective plate P1 contact areas about a plane parallel to the X-Y plane.

38. Sensor means as defined in claim 37 wherein N=3 such that there are two external plates P1 and P2 and one internal plate P3 arranged according to the laminated structure, and wherein at least part of the third electrode is located to contact both major surfaces of plate P3.

39. Sensor means as defined in claim 33 or 7 and further including means for securing an appropriate part of said sensor means to a driveshaft capable of rotational movement.

40. Sensor means as defined in claim 39 wherein the appropriate part of said sensor means comprises said first additional electrode.

41. Sensor means as defined in claim 39 wherein said sensor means has a through-hold coaxial with said Z axis, said hole being suitable for accommodating a driveshaft extending entirely through said sensor means.

42. Sensor means as defined in claims 2, 3, 4, 5, or 6 wherein said first and second electrodes are located to contact different major surfaces.

* * * * *

United States Patent [19]

Inoue

[11] 4,431,938
[45] Feb. 14, 1984

[54] GROOVED PIEZOELECTRIC RESONATING ELEMENT AND A MOUNTING THEREFORE

[75] Inventor: Jiro Inoue, Ishikawa, Japan

[73] Assignee: Murata Manufacturing Co., Ltd., Japan

[21] Appl. No.: 446,729

[22] Filed: Dec. 3, 1982

[30] Foreign Application Priority Data

| Dec. 9, 1981 [JP] | Japan | 56-198785 |
| Dec. 9, 1981 [JP] | Japan | 56-198786 |
| Dec. 9, 1981 [JP] | Japan | 56-198787 |
| Dec. 9, 1981 [JP] | Japan | 56-198788 |
| Dec. 9, 1981 [JP] | Japan | 56-198789 |

[51] Int. Cl.³ .................................. H01L 41/08
[52] U.S. Cl. ............................... 310/348; 310/366; 310/368; 310/355
[58] Field of Search ..................... 310/366–368, 310/348, 354–356

[56] References Cited

U.S. PATENT DOCUMENTS

| 2,543,500 | 2/1951 | Kettering et al. | 310/368 X |
| 4,336,510 | 6/1982 | Miyamori | 310/366 X |
| 4,370,583 | 1/1983 | Ljung | 310/367 X |

FOREIGN PATENT DOCUMENTS 832608  4/1960  United Kingdom ............... 310/368

Primary Examiner—Mark O. Budd
Attorney, Agent, or Firm—Ostrolenk, Faber, Gerb & Soffen

[57] ABSTRACT

A piezoelectric resonating element includes a piezoelectric plate (2) having an elongated rectangular shape with first and second major flat surfaces. The piezoelectric plate (2) is formed with an elongated groove (3) on the first major flat surface extending in an lengthwise direction of the piezoelectric plate (2) to separate the first major flat surface into first and second lands. A first electrode (6) is deposited on the first land, and a second electrode (7) is deposited on the second land. A third electrode (12) is deposited entirely on the second major flat surface. A dicing saw is used to form the groove and cut out the element from a mother piece. A piezoelectric resonating device employs the piezoelectric resonating element and it includes a base (14) for supporting the piezoelectric resonating element (1), first, second and third terminals connected to the element (1) for the external connection, a casing (18) for receiving the base (14), piezoelectric resonating element (1) and first, second and third terminals, and a sealant (35) applied at at an opening (32) of the casing (18).

13 Claims, 26 Drawing Figures